(12) United States Patent
Kirichenko

(10) Patent No.: US 8,406,834 B2
(45) Date of Patent: Mar. 26, 2013

(54) INJECTION LOCKED LONG JOSEPHSON JUNCTION PULSE SOURCE

(75) Inventor: Dmitri Kirichenko, Yorktown Heights, NY (US)

(73) Assignee: HYPRES, Inc., Elmsford, NY (US)

( * ) Notice: Subject to any disclaimer, the term of this patent is extended or adjusted under 35 U.S.C. 154(b) by 275 days.

(21) Appl. No.: 12/973,661

(22) Filed: Dec. 20, 2010

(65) Prior Publication Data
US 2012/0157321 A1  Jun. 21, 2012

(51) Int. Cl.
*H01L 23/48* (2006.01)
(52) U.S. Cl. .......................................... 505/190
(58) Field of Classification Search .................. 505/190, 505/329; 257/661–663
See application file for complete search history.

(56) References Cited

U.S. PATENT DOCUMENTS

| 6,331,805 | B1 * | 12/2001 | Gupta et al. | 331/107 S |
| 6,627,915 | B1 * | 9/2003 | Ustinov et al. | 257/31 |
| 6,728,131 | B2 * | 4/2004 | Ustinov | 365/162 |
| 2010/0102904 | A1 | 4/2010 | Kusmartsev | 333/24 R |

OTHER PUBLICATIONS

Cirillo et al. "Phase lock of a long Josephson junction to an external microwave source", J Appl Phys vol. 61, 2581 (1987).
Benabdallah et al, "Exponentially tapered Josephson flux flow oscillator", Phys Rev B vol. 54, 16139 (1996).
D. Kirichenko et al. "High quality on-chip long annular Josephson junction clock source for superconducting digital electronics", IEEE Trans. Appl. Supercond., vol. 15, 296 (2005).
Koshelets et al., "Spectral linewidth of autonomous and injection-locked flux-flow oscillators" Phys. Rev. B vol. 51, 6536 (1995).

* cited by examiner

*Primary Examiner* — Colleen Dunn
(74) *Attorney, Agent, or Firm* — George Sai-Halasz

(57) ABSTRACT

A superconducting circuit, and a method, are disclosed for generating pulses with stable frequency. The circuit includes an annular Long Josephson Junction (LJJ) capable of producing electrical pulses of a desired frequency due to a steady bias current applied to the LJJ. The circuit further includes an electrical interface for injecting an RF signal of a first frequency into the annular LJJ, resulting in the desired frequency locking onto the first frequency. Typically the first frequency substantially equals the desired frequency. The injection of the RF signal further results in the decrease of the frequency jitter of the desired frequency. The pulses generated in the loop section of the LJJ are outputted through a tail section of the LJJ, and through transmission lines which couple to the tail section.

26 Claims, 4 Drawing Sheets

INJECTION LOCKED LONG JOSEPHSON JUNCTION PULSE SOURCE

GOVERNMENT INTEREST

This invention was made with U.S. Government support under Small Business Innovation Research Contract W15P7T-07-C-A-001, awarded by the U.S. Army. The U.S. Government has certain rights in this invention.

BACKGROUND

The present invention relates to superconducting electronics. In particular, it relates to circuits generating pulses of a stable frequency suitable for distribution as clock signals.

BRIEF SUMMARY

A superconducting circuit, and a method, are disclosed for generating pulses with stable frequency. The circuit includes an annular Long Josephson Junction (LJJ) capable of producing electrical pulses of a desired frequency due to a steady bias current applied to the LJJ. The circuit further includes an electrical interface for injecting an RF signal of a first frequency into the annular LJJ, resulting in the desired frequency locking onto the first frequency. Typically, the first frequency substantially equals the desired frequency. The injection of the RF signal further results in an increase in the stability of the desired frequency, or alternately, in the decrease in the frequency jitter. The pulses generated in the loop section of the LJJ are outputted through a tail section of the LJJ and through transmission lines which are coupled to the tail section.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1A:
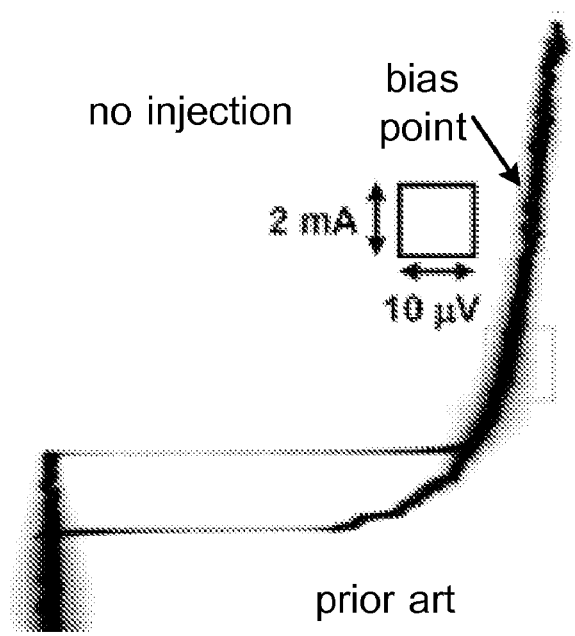
FIG. 1A shows a trace of the I-V characteristics of an annular long Josephson Junction (LJJ)

As superconducting circuit technology matures towards ever more complex chips and toward higher dynamic range performance, the need for precise and synchronous clocking is growing. With radio frequency (RF) clocks supplied from outside the superconductive environment scaling problems are emerging. A large high-frequency signal brought to the superconducting chip from room temperature may be the source of interference with data outputs. Furthermore, accumulation of jitter due to distributing a room temperature source is a further concern.

There is a need for developing superconducting precision frequency pulse circuits that may be used for clocking. Such a need has been recognized for some time. Schemes using an annular long Josephson Junction (LJJ), as the precision pulse generator, have emerged, showing encouraging results. An example may be, for instance: U.S. Pat. No. 6,331,805 to Gupta and Zhang entitled "On-chip long-Josephson-junction clock technology". However, there is still a need to further improve the stability of the pulse frequency.

Embodiments of the present invention teach a LJJ high frequency pulse generator with an external RF signal resonantly injected into the LJJ loop. The result is a superconducting precision pulse generator with reduced frequency jitter.

A LJJ high frequency pulse generator is based on resonant fluxon modes in the LJJ. A fluxon is a magnetic flux quantum: $\Phi_0 = h/2e = 2.07$ mV×ps. As it is well known, the term "long" in the LJJ refers to a two-dimensional geometry, which is much larger than the Josephson penetration depth ($\lambda_J$) in one dimension, and about the same size, or smaller, in the other, where $\lambda_J$ is typically several micrometers. Due to its closed topology, and being unperturbed by reflections from boundaries and collisions among the fluxons, an annular LJJ has good stability and a high quality factor (Q). One may think of an LJJ as a racetrack in which a fluxon, or fluxons, circulate in a given direction, and every completed lap by every fluxon produces an output pulse. For good pulse frequency stability and control, it may be desirable to have only a single fluxon circulating in the loop of the LJJ.

In order to realize fluxon states, magnetic flux quanta have to be trapped in the LJJ in a controlled manner. Recently in the art, the flux quanta trapping has been accomplished with a control current passed through a portion of the superconductor loop which forms one side of the LJJ. Representative embodiments of the present invention follow this method for trapping a controlled number, typically one, fluxon into the LJJ.

An annular LJJ acts as a clock source with frequency of $f = V_{dc}/\Phi_0$, when the junction is biased at a voltage of $V_{dc}$, and a single fluxon is circulating in the loop. The fluxon circulates at a velocity that depends on the dc bias current, and the frequency is inversely proportional to the circumference of the annular LJJ. In typical embodiments the LJJ is biased with a steady, direct, current to a location of the junction's I-V curve where there is a region of minimal voltage change as function of bias current. For a given LJJ geometry, only a limited range of frequencies are possible, which may be tuned slightly by varying the current. While some tunability is desirable to compensate for non-ideal fabrication, the steeper, and larger, the current step is in the LJJ's I-V curve, the more stable the output frequency becomes.

FIG. 1A shows a trace of the I-V characteristics of an annular LJJ, which may equivalently called LJJ oscillator. A bias point at the step corresponding to the natural resonant frequency for the LJJ oscillator is indicated by the arrow. FIG. 1A represents the state of the prior art, namely the LJJ is in its free running basic state. As can be seen, the I-V curve, although very steep, it has a manifest curvature which leads to a certain amount of frequency jitter in the frequency of the output pulses. The output frequency depends on the length of the LJJ's loop, or track.

Figure 1B:
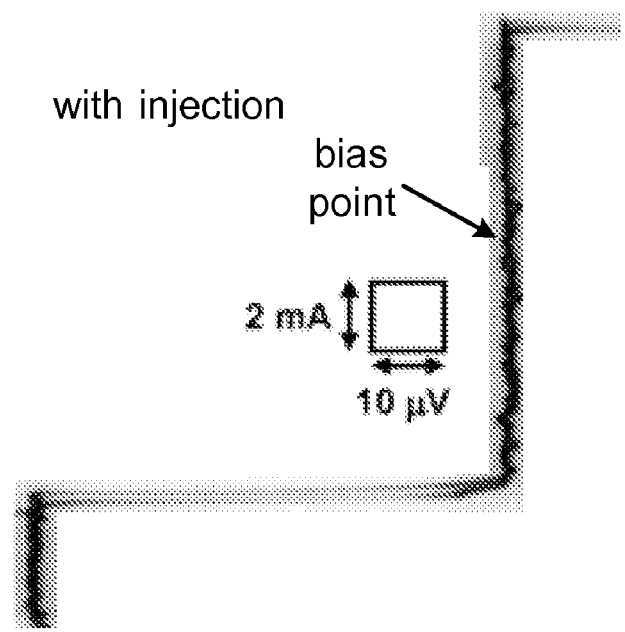
FIG. 1B shows a trace of the I-V characteristics of an annular LJJ with an RF signal resonantly injected.

FIG. 1B shows a trace of the I-V characteristics of an annular LJJ with a radio frequency (RF) signal resonantly injected. Embodiments of the present disclosure teach that the injection of an external RF signal into the LJJ loop, with a frequency that resonates with the natural free running frequency of the LJJ, within its narrow range of tunability, turns the step in the I-V curve steeper and taller. This effect is increasing with increasing injected power. The picture of FIG. 1B shows the same LJJ as in FIG. 1A, with +1 dBm RF power applied at 28.14 GHz, through an inductive electrical interface. This corresponds to a voltage on the step of 58.2 µV, corresponding to a pulse output frequency of 28.14 GHz.

For general terminology, one may call the free running frequency of the LJJ as the desired frequency, since one has control over this frequency through the manner the loop, or ring, of the LJJ is prepared. The LJJ oscillation, or pulse production, is due to a steady bias current applied to the LJJ. The desired frequency has a certain amount of frequency jitter, which may be undesirable. For example, if such a clock is used as a sampling clock for an analog-to-digital converter (ADC), clock jitter can lead to noise and nonlinearity in the data conversion. A free running LJJ may have a short-term, cycle-to-cycle, variation and a slower long-term drifting variation. For purposes of the embodiments of the present disclosure the term "jitter" is meant to encompass both short, and longer term variations.

When a first signal, which typically is an RF signal having a first frequency, which first frequency is substantially equal to the desired frequency, is injected into the LJJ's loop, the desired frequency locks onto the first frequency and the frequency jitter decreases. The frequency jitter decrease is due to the steepening and increasing of the step in the I-V characteristic. By stating that the first frequency is substantially equal to the desired frequency one understands that the match between the two does not have to be exact. The oscillating, or desired frequency, locks on to the first frequency even if the two frequencies were slightly different from one another, up to the small tunability range of the LJJ, typically of order several percent.

In some cases the injected RF signal may have the same effect when the first frequency instead of being substantially equal to the desired frequency, it is close to a subharmonic which is understood to be ½, ⅓, ..., or more generally an L/K ratio, of the desired frequency, where L and K are both integers and L is smaller than K. Again, with the understanding that the free running frequency locks onto a harmonic of the injected signal. Also, in some cases, the injected RF signal may not be a pure sinusoidal signal, so that it may comprise a wave with multiple harmonics. An example of such a non-sinusoidal injected signal would be a periodic pulse train.

As it is known in the art, to obtain a stable free running, or desired, frequency the loop, which may typically be of a racetrack shape, is biased through a plurality of resistors spaced around the loop in a preferably symmetrical, and preferably uniform, manner. At the same time the reduction of the frequency jitter by signal injection is most effective when the first signal couples into the loop of the LJJ in a non-uniform manner, representing a synchronization of the injected RF signal with the circulating fluxon pulse. Representative embodiments of the present invention often satisfy the dual aim of symmetric biasing and non-uniform outside RF signal coupling. There may be embodiments however, when the symmetry of the biasing resistors is relaxed, in combination with non-uniform, or uniform, injection, and possibly with varying loop shapes.

Figure 2A:
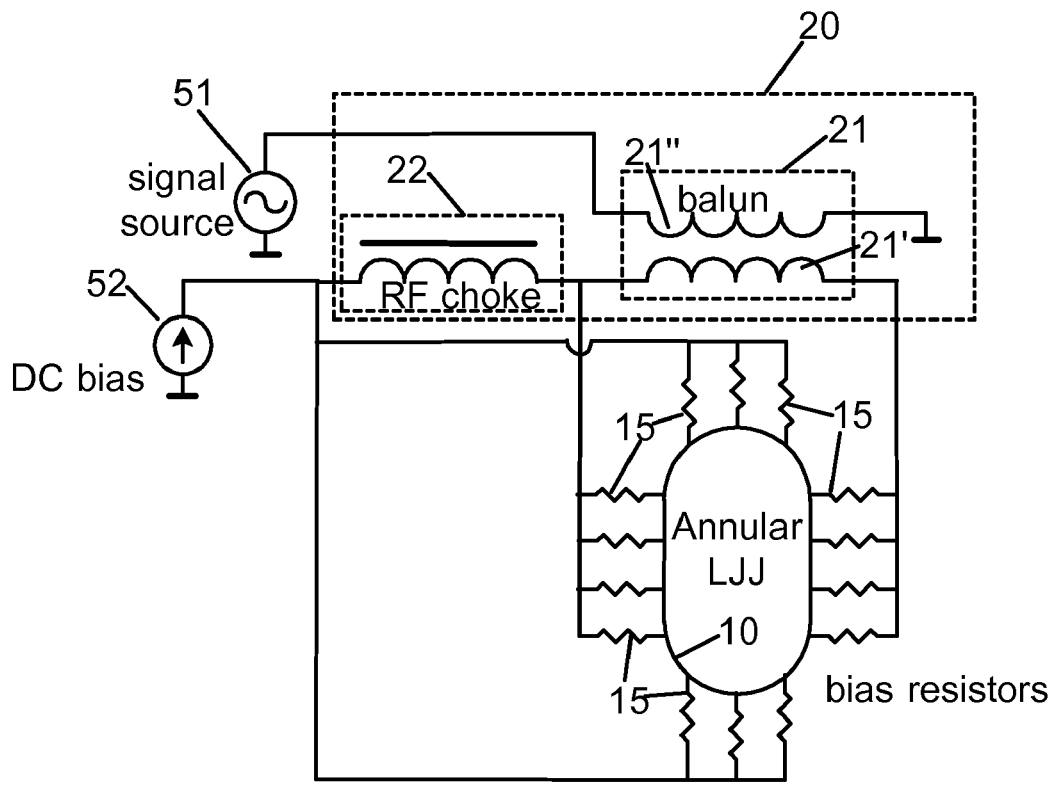
FIG. 2A shows a circuit schematic of a loop section of an LJJ with an electrical interface for inductively injecting an RF signal in an embodiment of the invention.

FIG. 2A shows a circuit schematic of a loop section of an LJJ with an electrical interface for inductively injecting an RF signal, in an embodiment of the invention. The figure shows a racetrack shaped loop section 10 of an LJJ. In some embodiments of the invention the LJJ consists only of the loop section 10, in further embodiments the LJJ may have other sections, as well.

A current source 52 supplies a steady bias current for the loop section. The steady bias current enters the loop section 10 through bias resistors 15 spaced around the loop section in a symmetrical, uniform manner. The circuit elements that have been discussed up to now are the ones of a free running LJJ, which is capable to produce pulses with the desired frequency, and with an inherent frequency jitter.

It is understood that the art of superconducting circuit technology is a mature one, and circuits such as the discussed pulse generator, or clock circuit, may contain additional elements known in the art that are not shown in the figures of the present disclosure. The presented figures may display only elements that are relevant for embodiments of the instant invention, but this should not be interpreted in a restrictive manner, nor assumed in a manner that would limit implementations of circuits.

Injection of the first signal, which originates from an RF signal source 51, and is of a first frequency, is done using an inductive electrical interface 20. The inductive electrical interface 20 has a transformer 21, which in a typical embodiment is a so called balun transformer, having a balanced 21' and an unbalanced 21" side. The unbalanced 21" side has a grounded termination. The first signal is received by the unbalanced 21" side from the source 51. The first signal, which is an RF signal, is injected into the LJJ loop section from the balanced side 21'. In general, it is desirable that the RF signal be injected into the loop 10 in a non-uniform manner. Non-uniformity may refer to either the spatial pattern of the injection, or the temporal pattern of the injection. The manner in which the first signal, coming from the transformer's balanced side 21', is ultimately coupled to the loop section 10, depends on how the bias resistors 15 are arranged, and on the particular shape of the loop 10, which may, or may not, be of a racetrack shape as presently depicted in the figure. In typical embodiments of the invention the balanced side 21' of the transformer 21 connects to at least two of the bias resistors 15. However, FIG. 2A should not be interpreted in a limiting manner. Generally with an inductive interface 20 one may use ways to inject the first signal into the loop section 10. For instance, one may bypass the biasing resistors and couple directly to the LJJ.

The coupling arrangement depicted in FIG. 2A may be one in a typical embodiment. This arrangement has the two leads of the transformer's 20 balanced side 21' each connecting to the bias resistors on only one side of the loop 10, with the two connected sides of the loop in opposing configuration. The inductive electrical interface 20 also has an RF choke 22 that is positioned to isolate from the first signal those of the bias resistors that are not connected to the balanced side 21'. For the embodiment shown in FIG. 2A, the bias resistors isolated from the RF signal by the RF choke 20 are on opposite sides of the curving sections of the racetrack shaped loop 10. With such an arrangement the longer opposing sides of the racetrack shaped loop section 10 receive the RF signal out of phase relative to one another, while the opposing curving sections do not receive the RF signal. It was found that embodiments having a racetrack shaped loop section 10, and having a first signal with substantially equal frequency as the free running frequency, and having the inductive injection arranged as depicted in FIG. 2A and herebefore described, delivered satisfying results in stabilizing the desired frequency and reducing the frequency jitter. Experiments with ADCs which were able to receive clock signals from both an external source and from a superconduction pulse circuit with coupling arrangements as shown in FIG. 2A, demonstrated that the superconducting pulse circuit was at least equally satisfying to the external source.

The satisfying results also extended to what one may call electrical quietness of the pulse generating circuit. Since the frequency of the injected RF signal, due to frequency locking, is the same as the output pulse frequency, the circuit has no other internal frequencies that may be "leaking out", and possibly disturb nearby sensitive circuits, such as, for instance, analog to digital converters (ADC). Due to the stable, low jitter, pulse stream that such a circuit produces, and due to the electrical quietness, the embodiment shown in FIG. 2A is well suited to be a clock signal generator.

Figure 2B:
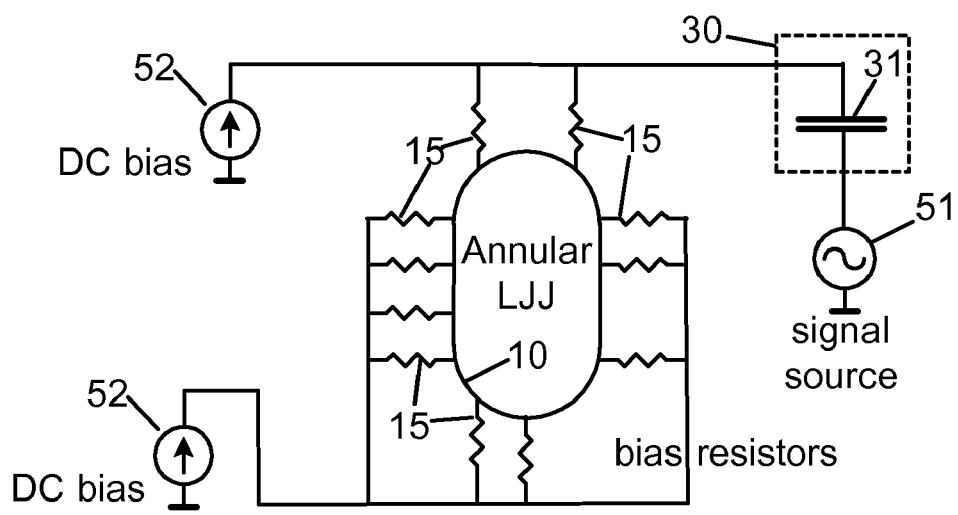
FIG. 2B shows a circuit schematic of a loop section of an LJJ with an electrical interface adapted to couple an RF signal into the steady bias current in an embodiment of the invention.

FIG. 2B shows a circuit schematic of a loop section 10 of an LJJ with an electrical interface adapted to couple an RF signal into the steady bias current, in an embodiment of the invention. In embodiments following this type of injection, the electrical interface 30 for coupling the RF, or first, signal into the LJJ, may only have a capacitor 31, which is to shield the RF signal source 51 from the steady bias current. Non-uniformity of the injection may be achieved through the use of additional DC bias source, or sources, that provides current bias to at least a portion of bias resistors not connected to the RF source 51. The DC bias sources, with all bias current sources being indicated by the same indicator number, 52, due to their similar roles, are adjusted to maintain uniform dc bias around the LJJ. In its depiction of non-uniformity of the bias resistor coupling around the loop section 10, FIG. 2B should be regarded as strictly symbolic, taking no inference, or limitation, regarding actual bias resistor arrangements in embodiments of the invention. One may find many differing manners to arrange the bias resistors 15, or to change the shape of the loop, in order to optimize the frequency locking to the injected first signal, and the reduction of frequency jitter. With this type of electrical interface 30 all the bias resistors 15 connected to the RF signal source 51 receive the RF signal, and all in the same phase.

In representative embodiments of the invention the RF source 51 itself may be located anywhere, inside or outside the cryogenic environment, and may be of any type known in the art. And, as illustrated in FIG. 2B, there may even be a plurality of them serving the same circuit.

Figure 3:
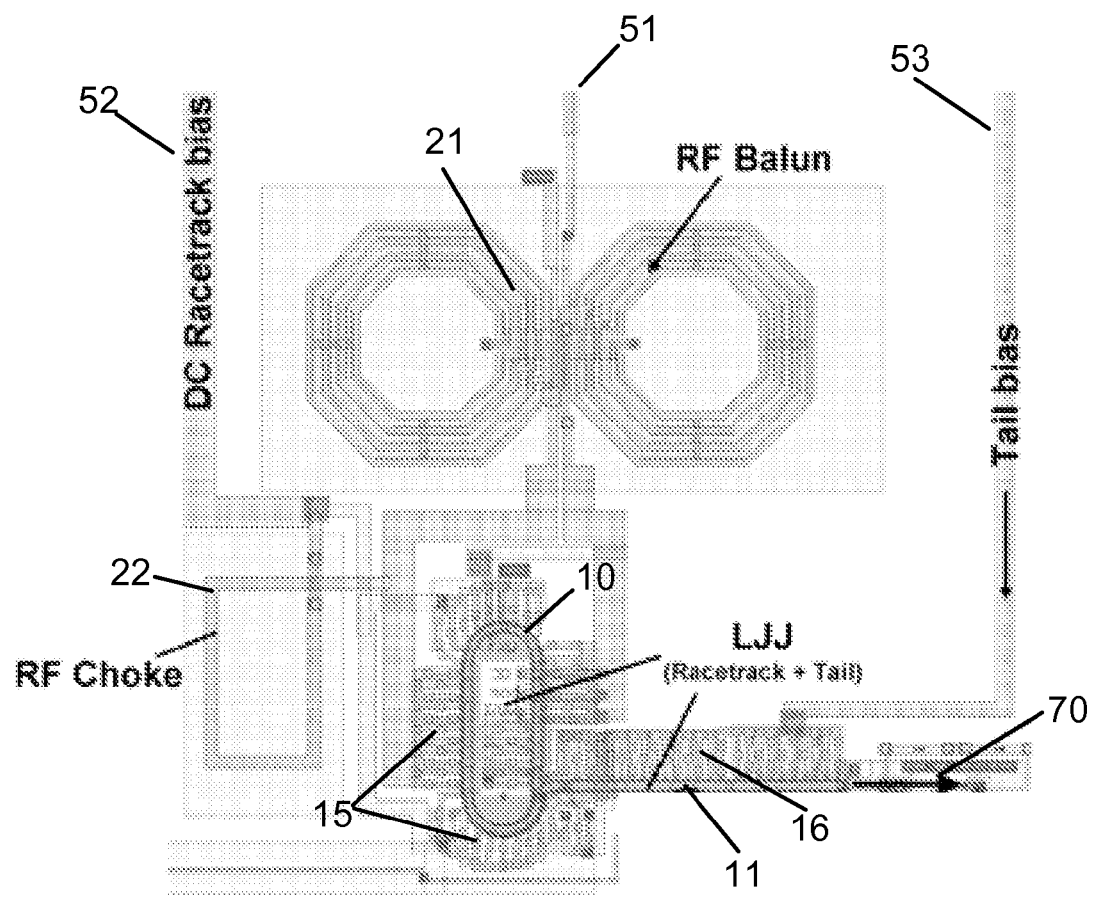
FIG. 3 shows a micrograph of a portion of a superconducting circuit chip displaying a clock section with an LJJ, and an inductive electrical interface for resonant RF signal injection.

FIG. 3 shows a micrograph of a portion of a superconducting circuit chip displaying a clock section with an LJJ, and an inductive electrical interface for resonant RF signal injection. FIG. 3 shows a hardware realization essentially of the schematic depicted in FIG. 2A. The shown circuit is part of a larger chip which was exercised in a 1.5 μm linewidth Nb technology, corresponding to a junction current density of 4.5 kA/cm$^2$. The circumference of the loop section 10 is about 170 μm. The RF signal source itself is not visible in FIG. 3, but a lead arriving from the source and carrying the RF, or first, signal is shown, and indicated as 51, playing an equivalent role to the source as shown in FIG. 2. The transformer 21, marked as "RF Balun", receives the first signal and passes it on to the racetrack shaped loop section 10 of the LJJ. The figure shows another section, a tail section 11, of the LJJ, as well. The steady bias current lead 52 has the role of the source in this figure, hence the identical indicator number. The RF choke 22 shields a portion of the loop's bias resistors 15 from the RF signal coming from the RF Balun 21. The tail section 11 of the LJJ, has its own bias resistors 16 and bias current lead 53.

Figure 4A:
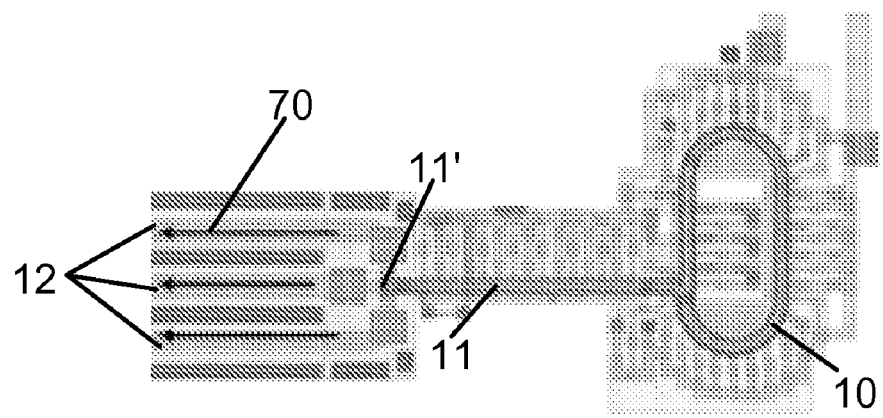
FIG. 4A shows a micrograph of a portion of a superconducting circuit chip displaying a LJJ having a loop section and a tail section, and transmission lines attached to the end of the tail section.
Figure 4B:
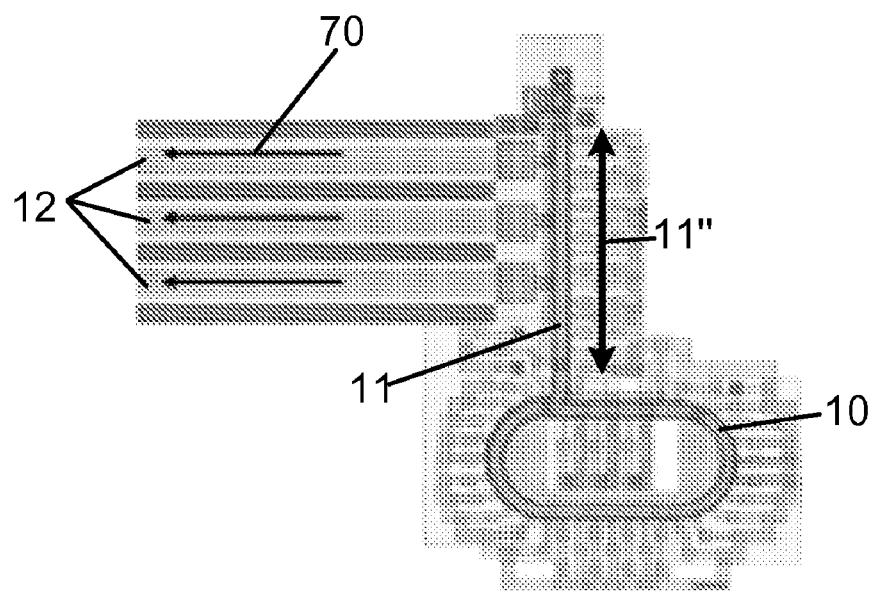
FIG. 4B shows a micrograph of a portion of a superconducting circuit chip displaying a LJJ having a loop section and a tail section, and transmission lines attached along the length of the tail section.

FIG. 4A shows a micrograph of a portion of a superconducting circuit chip displaying a LJJ having a loop section and a tail section, and transmission lines attached to the end of the tail section. This figure, and FIG. 4B, depict embodiments of the instant invention that deal with outputting of the pulse train generated by the loop section 10. It is known in the art that pulses may be removed from the loop section itself. It was also disclosed earlier, see for instance, D. Kirichenko et al. "High quality on-chip long annular Josephson junction clock source for superconducting digital electronics", IEEE Trans. Appl. Supercond., Vol. 15, 296 (2005), that it is a better way to output 70 the pulses generated by the loop section 10 through a tail section 11 of the LJJ emanating from the loop section 10, than by extracting the pulses directly from the loop section. Embodiments of the present invention teach attaching transmission lines 12 to the tail section 11, and therein outputting multiple pulses for distribution outside the pulse generating superconducting circuit. Being able to put out multiple high frequency precision pulse streams is a typical requirement of clock signal generating circuits. The tail section 11 is also current-biased and transmits a fluxon.

Embodiment of the present invention teach two manners to couple transmission lines 12 to the tail section 11. One of the ways is depicted in FIG. 4A. Here the transmission lines are coupled to the end 11' of the tail section 11. In this arrangement the electrical pulses in differing ones of the transmission lines 12 have identical phases, namely they are simultaneously transmitted 70 to outside circuits. The impedances of the transmission lines, together with series damping resistors connected to the LJJ tail, must be selected so as to properly terminate the fluxon pulse output.

FIG. 4B shows a micrograph of a portion of a superconducting circuit chip displaying a LJJ having a loop section 10 and a tail section 11, and transmission lines attached along the length 11" of the tail section. This is the second manner in coupling transmission lines 12 to the tail section 11. When transmission lines 12 are coupled along the length 11" of the tail section 11, the electrical pulses in differing ones of the transmission lines 12 are phase shifted relative to one another, namely the output 70 pulses will be time delayed compared to one another. There are applications, for instance for multi-level ADCs, when such time shifted pulse trains are required. The LJJ taught in the embodiments of the present invention, with its loop section 10 and tail section 11, is capable to produce simultaneous, or time shifted, or both, pulse trains, to serve as a clock signal generator, or to fulfill other needs as they arise.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A superconducting circuit, comprising:
an annular Long Josephson Junction (LJJ) capable of producing electrical pulses of a desired frequency resulting from a steady bias current applied to said LJJ, wherein said annular LJJ comprises a loop section; and
an electrical interface for injecting a first signal of a first frequency into said loop section, wherein said desired frequency locks to said first frequency.

2. The superconducting circuit of claim 1, wherein said desired frequency has a frequency jitter, and said frequency jitter decreases due to said injecting of said first signal.

3. The superconducting circuit of claim 1, wherein said first frequency substantially equals, or is a subharmonic, of said desired frequency.

4. The superconducting circuit of claim 1, wherein said first signal is injected into said loop section in a non-uniform manner.

5. The superconducting circuit of claim 1, wherein said electrical interface is an inductive interface.

6. The superconducting circuit of claim 5, wherein said inductive interface comprises a transformer having a balanced and an unbalanced side, wherein said first signal is received by said unbalanced side, and said first signal is injected into said loop section from said balanced side.

7. The superconducting circuit of claim 6, wherein said steady bias current is applied to said LJJ through bias resistors spaced around said loop section, and said balanced side connects to at least two of said bias resistors.

8. The superconducting circuit of claim 7, wherein said inductive interface further comprises an RF choke, wherein said RF choke isolates from said first signal those of said bias resistors that are not connected to said balanced side.

9. The superconducting circuit of claim 1, wherein said electrical interface is adapted to couple said first signal into said steady bias current.

10. The superconducting circuit of claim 1, wherein said annular LJJ further comprises a tail section emanating from said loop section, wherein said tail section serves as an output port for said electrical pulses of said desired frequency.

11. A superconducting circuit, comprising:
an annular Long Josephson Junction (LJJ) producing electrical pulses, wherein said LJJ comprises a loop section and a tail section emanating from said loop section; and
a plurality of transmission lines coupled to said tail section, wherein said transmission lines accept said electrical pulses for distribution outside said superconducting circuit.

12. The superconducting circuit of claim 11, wherein said tail section has an end, and said transmission lines couple to said tail section at said end, thereby said electrical pulses in differing ones of said transmission lines have identical phases.

13. The superconducting circuit of claim 11, wherein said tail section has a length, and said transmission lines couple to said tail section along said length, thereby said electrical pulses in differing ones of said transmission lines are phase shifted relative to one another.

14. A method, comprising:
applying a steady bias current to an annular Long Josephson Junction (LJJ), wherein said LJJ is capable of producing electrical pulses with a desired frequency, and wherein said annular LJJ comprises a loop section; and
injecting a first signal of a first frequency into said loop section through an electrical interface, wherein said desired frequency locks to said first frequency.

15. The method of claim 14, wherein said desired frequency has a frequency jitter, said method further comprises decreasing said frequency jitter by said injecting of said first signal.

16. The method of claim 14, wherein said method further comprises selecting said first frequency to be the same, or a subharmonic, of said desired frequency.

17. The method of claim 14, wherein said method further comprises injecting said first signal in a non-uniform manner into said loop section.

18. The method of claim 14, wherein said method further comprises selecting said electrical interface to be an inductive interface.

19. The method of claim 18, wherein said method further comprises using in said inductive interface a transformer having a balanced and an unbalanced side; and
receiving said first signal in said unbalanced side, and injecting said first signal into said loop section from said balanced side.

20. The method of claim 19, wherein said method further comprises applying said steady bias current to said LJJ through bias resistors spaced around said loop section; and
connecting said balanced side to at least two of said bias resistors.

21. The method of claim 20, wherein said method further comprises using in said inductive interface an RF choke, and using said RF choke to isolate from said first signal those of said bias resistors that are not connected to said balanced side.

22. The method of claim 14, wherein said method further comprises using said electrical interface to couple said first signal into said steady bias current.

23. The method of claim 14, wherein said annular LJJ further comprises a tail section emanating from said loop section, and said method further comprises outputting said electrical pulses with said desired frequency from said tail section.

24. A method, comprising:
producing electrical pulses with an annular Long Josephson Junction (LJJ), wherein said LJJ comprises a loop section and a tail section emanating from said loop section; and
coupling a plurality of transmission lines to said tail section, and accepting said electrical pulses in said transmission lines.

25. The method of claim 24, wherein said tail section has an end and said method further comprises coupling said transmission lines to said tail section at said end, thereby said electrical pulses in differing ones of said transmission lines have identical phases.

26. The method of claim 24, wherein said tail section has a length, and said method further comprises coupling said transmission lines to said tail section along said length, thereby said electrical pulses in differing ones of said transmission lines are phase shifted relative to one another.

* * * * *